United States Patent
Miyahara

(10) Patent No.: US 9,374,104 B2
(45) Date of Patent: Jun. 21, 2016

(54) SAMPLE HOLD CIRCUIT, A/D CONVERTER, CALIBRATION METHOD OF THE SAMPLE HOLD CIRCUIT, AND CIRCUIT

(71) Applicant: ASAHI KASEI MICRODEVICES CORPORATION, Tokyo (JP)

(72) Inventor: Yuichi Miyahara, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 14/424,111

(22) PCT Filed: Aug. 12, 2013

(86) PCT No.: PCT/JP2013/004838
§ 371 (c)(1),
(2) Date: Feb. 26, 2015

(87) PCT Pub. No.: WO2014/038138
PCT Pub. Date: Mar. 13, 2014

(65) Prior Publication Data
US 2015/0229320 A1    Aug. 13, 2015

(30) Foreign Application Priority Data

Sep. 7, 2012    (JP) ................................. 2012-196961

(51) Int. Cl.
*H03M 1/12* (2006.01)
*H03M 1/10* (2006.01)
(Continued)

(52) U.S. Cl.
CPC .......... *H03M 1/1245* (2013.01); *H03M 1/0604* (2013.01); *H03M 1/1033* (2013.01); *H03M 1/1057* (2013.01); *H03M 1/164* (2013.01); *H03M 1/44* (2013.01)

(58) Field of Classification Search
CPC ..... H03M 1/162; H03M 1/1245; H03M 1/12; H03M 1/442; H03M 1/0682; H03M 1/1023; H03M 1/44; H03M 1/468; H03M 1/40; H03M 1/1009; H03M 1/1057; H03M 1/0641; H03M 1/00; H03M 1/804; H03M 1/10

USPC .................. 341/118, 121, 131, 137, 155, 172
See application file for complete search history.

(56) References Cited

U.S. PATENT DOCUMENTS 2,271,750 A * 2/1942 Vandercook ........ B41F 33/0018
101/270
7,304,598 B1 * 12/2007 Bogner ............... H03M 1/0663
341/156

(Continued)

FOREIGN PATENT DOCUMENTS

JP    H02-057616 U    4/1990
JP    3-330863 A    12/1996

(Continued)

OTHER PUBLICATIONS

International Preliminary Report on Patentability dated Mar. 10, 2015, for the corresponding International application No. PCT/JP2013/004838.

(Continued)

*Primary Examiner* — Linh Nguyen
(74) *Attorney, Agent, or Firm* — Morgan, Lewis & Bockius LLP

(57) ABSTRACT

There is provided a pipelined A/D converter in which plural stages Stage 1 to Stage N each including an MDAC (i.e., Multiplying DA Converter) are connected. The pipelined A/D converter is configured with a Gain-AMP (12) included in the MDAC for the SPM, MOS transistors (Mx1) and (Mx2) as a differential pair having output ends connected to a sampling capacitor CsI on a subsequent stage, MOS transistors (My1) and (My2) as a load unit connected to the differential pair, a current source (I3) configured to supply a current to the MOS transistors (Mx1) and (Mx2) as the differential pair, and current sources (I1) and (I2) configured to adjust the current flown across the MOS transistors (My1) and (My2) as the load unit.

15 Claims, 8 Drawing Sheets

(51) Int. Cl.
*H03M 1/06* (2006.01)
*H03M 1/16* (2006.01)
*H03M 1/44* (2006.01)

(56) References Cited

U.S. PATENT DOCUMENTS

| | | | |
|---|---|---|---|
| 8,339,303 | B2 | 12/2012 | Ali et al. |
| 8,358,228 | B2 | 1/2013 | Ali et al. |
| 2002/0113726 | A1* | 8/2002 | Nagaraj ............. H03M 1/0604 341/156 |
| 2003/0128067 | A1* | 7/2003 | Jaussi ................ H03H 11/1213 327/552 |
| 2003/0132872 | A1* | 7/2003 | Casper ................ H03F 3/45183 341/161 |
| 2004/0263367 | A1 | 12/2004 | Batruni |
| 2005/0237694 | A1 | 10/2005 | Kapusta, Jr. et al. |
| 2006/0082479 | A1 | 4/2006 | Batruni |
| 2007/0120725 | A1* | 5/2007 | Huang ................. H03M 1/066 341/161 |
| 2007/0146064 | A1* | 6/2007 | Morie ................ H03F 3/45475 327/563 |
| 2009/0055678 | A1* | 2/2009 | Kummaraguntla ....... G06F 1/04 713/600 |
| 2009/0096646 | A1* | 4/2009 | Lee ..................... H03M 1/1225 341/122 |
| 2009/0102688 | A1* | 4/2009 | Cesura et al. .................. 341/110 |
| 2010/0149010 | A1 | 6/2010 | Morie et al. |
| 2012/0268302 | A1* | 10/2012 | Etou ................... H03M 1/0604 341/161 |
| 2013/0120171 | A1 | 5/2013 | Dinc et al. |
| 2013/0187801 | A1* | 7/2013 | de Figueiredo ..... H03M 1/1009 341/118 |

FOREIGN PATENT DOCUMENTS

| | | |
|---|---|---|
| JP | H11-298262 A | 10/1999 |
| JP | 2007-521743 A | 8/2007 |
| JP | 2007-534280 A | 11/2007 |
| JP | 2012-060519 A | 3/2012 |
| WO | 2009/034683 A1 | 3/2009 |

OTHER PUBLICATIONS

Ali et al, "A 16-bit 250-MS/s IF Sampling Pipelined ADC With Background Calibration", IEEE Journal of Solid-State Circuits, vol. 45, No. 12, Dec. 2010, pp. 2602-2612.

Ali et al., "A 16b 250MS/s IF-Sampling Pipelined A/D Converter with Background Calibration", ISSCC2010, Feb. 9, 2010.

Miyahara et al., "Adaptive Cancellation of Gain and Nonlinearity Errors in Pipelined ADCs", ISSCC2013.

Miyahara et al., "A 14b 60 MS/s Pipelined ADC Adaptively Cancelling Opamp Gain and Nonlinearity", IEEE Journal of Solid-State Circuits, vol. 49, No. 2, Feb. 2014.

Ali et al., "Background calibration of operational amplifier gain error in pipelined A/D converters", IEEE Transactions on Circuts and Systems, vol. 50, No. 8, Sep. 2003.

Sin et al., "A novel low-voltage finite-gain compensation technique for high-speed reset- and switched-opamp circuits,"in Proc. IEEE Int. Symp. Circuits and Systems, ISCAS, 2006, pp. 3794-3797, Sep. 2006.

Murmann et al., "A 12-bit 75 MS/s pipelined ADC using open-loop residue amplification," IEEE J. Solid-State Circuits, vol. 38, No. 12, pp. 2040-2050, Dec. 2003.

Keane et al., "Background interstage gain calibration technique for pipelined ADCs," IEEE Trans. Circuits Syst. I, vol. 52, No. 1, pp. 32-43, Jan. 2005.

Panigada et al., "A 130 mW 100 MS/s pipelined ADC with 69 dB SNDR enabled by digital harmonic distortion correction," IEEE J. Solid-State Circuits, vol. 44, No. 12, pp. 3314-3328, Dec. 2009.

Brooks et al., "A Zero-Crossing-Based 8-bit 200MS/s pipelined ADC", IEEE Journal of Solid-State Circuits, vol. 42, No. 12, Dec. 2007.

Park et al., "A 0.13μm CMOS 78dB SNDR 87mW 20MHz BW CT ΔΣ ADC with VCO-Based Integrator and Quantizer", IEEE International Solid-State Circuits Conference, Feb. 2009.

Song et al., "A 10-b, 15-MHz CMOS recycling two-step A/D converter," IEEE J. Solid State Circuits, vol. 25, No. 6, pp. 1328-1338, Dec. 1990.

Li et al., "A ratio-independent algorithmic analog-to-digital conversion technique," IEEE J. Solid-State Circuits, vol. SC-19, No. 6, pp. 828-836, Dec. 1984.

Brooks et al., "A cascaded sigma-delta pipeline A/D converter with 1.25 MHz signal bandwidth and 89 dB SNR," IEEE J. Solid-State Circuits, vol. 32, No. 12, pp. 1896-1906, Dec. 1997.

Shu et al., "A 15-bit Linear 20-MS/s Pipelined ADC Digitally Calibrated With Signal-Dependent Dithering", IEEE Journal of Solid-State Circuits, vol. 43, No. 2, Feb. 2008.

Mehr et al., "A 55-mW, 10-bit, 40-Msample/s Nyquist-rate CMOS ADC," IEEE J. Solid-State Circuits, vol. 35, No. 3, pp. 318-325, Mar. 2000.

Abo et al., "A 1.5-V, 10-bit, 14.3-MS/s CMOS pipelined analog-to-digital converter," IEEE J. Solid-State Circuits, vol. 34, No. 5, pp. 599-606, May 1999.

Bruccoleri et al., "Noise cancelling in wideband CMOS LNAs," in IEEE Int. Solid-State Circuits Conf. Feb. 2002.

International Search Report dated Nov. 5, 2013 for International application No. PCT/JP2013/004838.

Office Action dated Mar. 21, 2016 from the Taiwan Patent Office in counterpart Taiwanese application No. 102129169.

* cited by examiner

SAMPLE HOLD CIRCUIT, A/D CONVERTER, CALIBRATION METHOD OF THE SAMPLE HOLD CIRCUIT, AND CIRCUIT

TECHNICAL FIELD

The present disclosure relates to a sample hold circuit, in particular to a circuit (for example, a pipelined A/D converter, a ΔΣA/D converter, and the like) configured to convert an input signal by using amplification by an operational amplifier to an output signal.

BACKGROUND ART

A pipelined A/D converter can be mentioned as a circuit using the sample hold circuit. As a pipelined A/D converter 10, for example, a circuit illustrated in FIG. 7 is known (for example, see PLT 1).

Such a pipelined A/D converter 10 is configured, as illustrated in FIG. 7, such that N stages of unit blocks 100 (1) to 100(N), from Stage1 to StageN, are made in cascade connection.

Since each of the unit blocks 100(1) to 100(N) has an identical configuration, the configuration of Stage1 (i.e., unit block 100(I)) will be described, herein.

As illustrated in FIG. 7, the StageI includes an SSH (i.e., Sub Sample Hold) circuit 101, an SADC (i.e., Sub AD Converter) circuit 102, a DAC (i.e., D/A Converter) circuit 103, and an adder 104.

The SSH circuit 101 of the StageI receives an analog output signal ResidueI−1 output from a unit block StageI−1 on a previous stage.

The SADC circuit 102 is provided for carrying out an A/D conversion on the analog output signal ResidueI−1 received by the SSH circuit 101 into a digital signal DigitalI. The digital signal DigitalI is output as an output signal (i.e., DigitalI) of the Stage1. It is to be noted that the digital signal DigitalI output from the SADC circuit 102 is summed with a digital signal DigitalI output from the SADC circuit 102 of each of the Stage1 to StageN, in a predefined rule. The result is output as a digital output signal representing an A/D conversion result.

The DAC circuit 103 generates an analog signal corresponding to the digital signal DigitalI from the SADC circuit 102, and outputs it to the adder 104.

The adder 104 subtracts the analog signal generated by the DAC circuit 103 from the analog signal received by the SSH circuit 101, and outputs the analog signal that is a subtraction result, as ResidueI which is a residue signal to a unit block StageI+1 on a subsequent stage. In this situation, the analog signal (i.e., ResidueI) as the residue signal which is obtained by subtraction at the adder 104 is amplified by a predefined multiplication, so that the A/D conversion is enabled by the identical unit block (i.e., Stage) configuration without increasing the demanded accuracy of the unit block StageI+1 on the subsequent stage. Hence, the A/D conversion with high accuracy is achieved.

In the meantime, the SSH circuit 101, the DAC circuit 103, and the adder 104 are generally configured with a combination of a single operational amplifier and a capacitance CAP. The circuit configured by combining the operational amplifier and the capacitance CAP is referred to as Multiplying DAC (i.e., MDAC: Multiplying Digital Analog Convertor) 105.

FIG. 8A and FIG. 8B are schematic configuration views illustrative of an example of the MDAC 105.

In FIG. 8A and FIG. 8B, FIG. 8A illustrates a circuit configuration in a sampling phase (i.e., Sampling Phase), and FIG. 8B illustrates a circuit configuration in a holding phase (i.e., Holding Phase). The MDAC 105 realizes the circuit of FIG. 8A in the sampling phase by selectively changing a switch, not illustrated, depending on a conversion clock signal CLK, and realizes the circuit of FIG. 8B in the holding phase. It is to be noted that a variable I of "CsI" in FIG. 8A means Cs included in the StageI.

As illustrated in FIG. 8A and FIG. 8B, the MDAC 105 includes a sampling capacitor CsI in which unit capacities each having the same size are combined in parallel to each other, an MDAC-AMP 11 configured with an operational amplifier, and a parasitic capacitance Cp present at an input end of the MDAC-AMP 11. The MDAC 105 operates to alternatively achieve the sampling phase (of FIG. 8A) and the holding phase (of FIG. 8B) depending on the conversion clock signal CLK to be input.

In the sampling phase (of FIG. 8A), an analog output signal ResidueI−1 of the unit block StageI−1 on the previous stage is charged in the sampling capacitor CsI. In other words, the analog output signal ResidueI−1 is input into one end of the sampling capacitor CsI, whereas the other end thereof is connected with an inverting input terminal of the MDAC-AMP 11. Then, the input end and output end of the MDAC-AMP 11 are short-circuited on the ground level. The parasitic capacitance Cp is similarly short-circuited to the ground level.

On the other hand, in the holding phase (of FIG. 8B), the output end of the MDAC-AMP 11 and an inverting input end thereof are connected through a capacitance Cf. Also, as to the capacitance Cr, each of plural unit capacitances included in the capacitance Cr is connected to anyone of "+Vr", "zero", or "−Vr" depending on the digital signal Digital' output from the SADC circuit 102 of FIG. 7. In other words, one end of the capacitance Cr is connected to any one of "+Vr", "zero", or "−Vr", whereas the other end is connected to the inverting input end of the MDAC-AMP 11.

The capacitance Cf and the capacitance Cr are each configured with a part of the plural unit capacitances included in the sampling capacitor CsI. In other words, as to the sampling capacitor CsI, in the holding phase, a part of the unit capacitances included in the sampling capacitor CsI is used as the capacitance Cf that connects the output end and the inverting input end of the MDAC-AMP 11, and the remaining unit capacitances are used as the capacitance Cr.

It is to be noted that, here, the description has been given of a case where a part of the plural unit capacitances included in the sampling capacitor CsI is used as the capacitance Cf and the capacitance Cr. However, this configuration is not always the case. For example, the plural unit capacitances included in the sampling capacitor CsI are used as the capacitances Cr without change, and the capacitance Cf may be provided separately.

The output from the MDAC-AMP 11 is connected to a sampling capacitor CsI+1 of an MDAC 105 configuring a unit block of StageI+1 on a subsequent stage, the output from the MDAC-AMP 11 of StageI is output to the sampling capacitor CsI+1 on the subsequent stage, as the analog output signal ResidueI. Also, a non-inverting input end of the MDAC-AMP 11 is kept on the ground level.

In this situation, when the DC (i.e., direct current) gain of the MDAC-AMP 11 is assumed to be "a0", a voltage Va at the inverting input end of the MDAC-AMP 11 can be represented by following expression (1), by use of a voltage Vout at the output end of the MDAC-AMP 11.

$$Va = -(1/a0)Vout \quad (1)$$

For example, in a case where all the voltages connected to the unit capacitances included in the capacitance Cr are zero, following expression (2) is satisfied from the law of conservation of charge accumulated in the capacitance in the sampling phase and holding phase.

$$CsI \times Vin = Cf(Vout - Va) + Cr(0 - Va) + Cp(0 - Va) \quad (2)$$

From the above expressions (1) and (2), the output ResidueI from the MDAC-AMP 11, namely the output Vout from the MDAC 105, in the holding phase, can be represented by following expression (3).

$$Vout = (CsI/Cf) \times \{1/(1 + 1/(a0 \times f))\} \times Vin \quad (3)$$

Here, "a0" in the expression (3) represents the DC (i.e., direct current) gain of the MDAC-AMP 11, as described above. Also, "f" refers to feedback factor of the MDAC-AMP 11, and can be represented by following expression (4) by use of the respective capacitances Cr, Cf, and Cp.

$$f = Cf/(Cr + Cf + Cp) \quad (4)$$

In a transfer function represented by the expression (3), when an input/output property is ideal, the expression (3) can be represented by following expression (5).

$$Vout = (CsI/Cf) \times Vin \quad (5)$$

From the expressions (3) and (5), in order to make the ideal input/output property available, it is understood that the DC Gain "a0" of the MDAC-AMP 11 has to be large enough to the infinity.

Actually, the DC Gain "a0" is increased according to the demanded accuracy.

In general, a multistage or cascode configuration is needed to increase the DC Gain of the AMP. Therefore, there arises a problem in that keeping a good stability is difficult or the output amplitude is subject to a limitation.

To solve such a problem, As a method of obtaining a high gain property without increasing the DC Gain "a0", there is a technique called Summing Point Monitoring (hereinafter, referred to as SPM).

FIG. 9A and FIG. 9B are a specific example of achieving the SPM. FIG. 9A is a circuit configuration in the sampling phase, and FIG. 9B is a circuit configuration in the holding phase.

In this circuit, after a voltage Va at the Summing Point is sampled (added) at a capacitance Ce1 once, f' is made available with a ratio of capacitances Ce1 and Ce2 by use of a feedback circuit of the AMP. In this example, Cp' represents a parasitic capacitance present at the input end of a Gain-AMP 12.

FIG. 9C is another specific example of achieving the SPM (for example, see non-PLT 1).

In this circuit, the voltage is sampled at the capacitance Ce1, and is then transferred through the capacitance Ce2.

CITATION LIST

Patent Literature

PLT 1: JP 2012-60519 A

Non Patent Literature

NPL 1: "A 16-bit 250-MS/s IF Sampling Pipelined ADC With Background Calibration", IEEE JOURNAL OF SOLID-STATE CIRCUITS, VOL. 45, NO. 12, DECEMBER 2010, p. 2602-p. 2612

SUMMARY

Technical Problem

When new capacitances such as Ce1 and Ce2 are added as described, however, this poses a problem that the property of the overall ADC deteriorates due to the noise caused by the newly added capacitances.

The present disclosure has been made in view of the above circumstances, and provides a sample hold circuit, an A/D converter, a calibration method of the sample hold circuit, and a circuit, in which noises are small.

Solution to Problem

In one embodiment of the present disclosure, there is provided a sample hold circuit, including: a sampling capacitor (for example, sampling capacitor CsI in FIG. 2A and FIG. 2B); a first amplifier (for example, MDAC-AMP 11 in FIG. 2A and FIG. 2B) having an input end to which the sampling capacitor is connected; and a second amplifier (for example, Gain-AMP 12 in FIG. 2A and FIG. 2B) connected to the first amplifier, wherein the second amplifier includes: a differential pair (for example, MOS transistors Mx1 and Mx2 in FIG. 3); a load unit (for example, MOS transistors My1 and My2 in FIG. 3) connected to the differential pair; and a variable current unit (for example, current sources I1 to I3 in FIG. 3) configured to supply a current to at least one of the differential pair or the load unit, wherein in a holding phase, the second amplifier is configured to monitor a voltage (for example, Va in FIG. 2B) at a summing point that is a connection point of the sampling capacitor at the input end of the first amplifier.

DESCRIPTION OF EMBODIMENTS

Hereinafter, embodiments of the present disclosure will be described.

Figure 1:
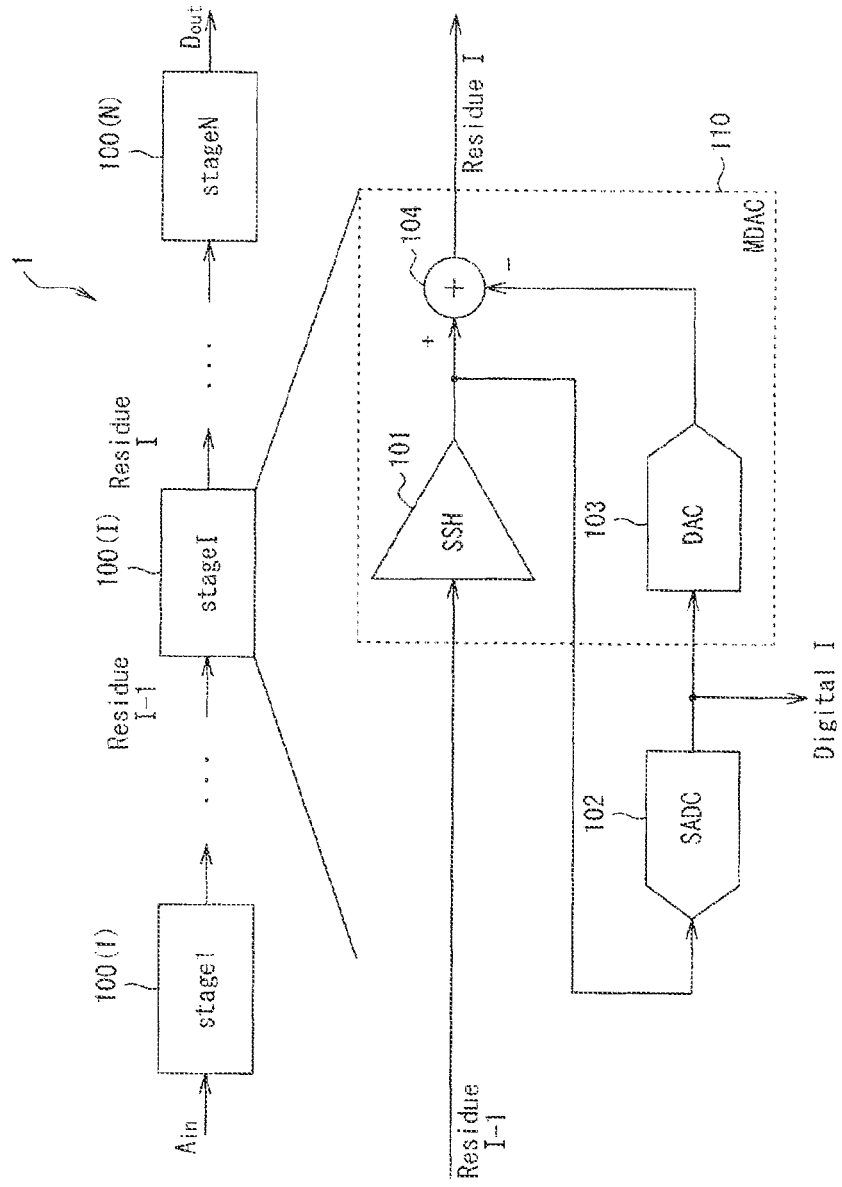
FIG. 1 is a schematic configuration view illustrative of an example of a pipelined A/D converter to which a sample hold circuit in one embodiment of the present disclosure is applied.

FIG. 1 is a conceptual view illustrative of an example of a pipelined A/D converter (hereinafter, referred to as A/D converter) 1. In one embodiment of the present disclosure, a sample hold circuit in one embodiment of the present disclosure is applied to a Multiplying D/A Converter (hereinafter, referred to as MDAC) 110 included in the pipelined A/D converter 1.

Figure 7:
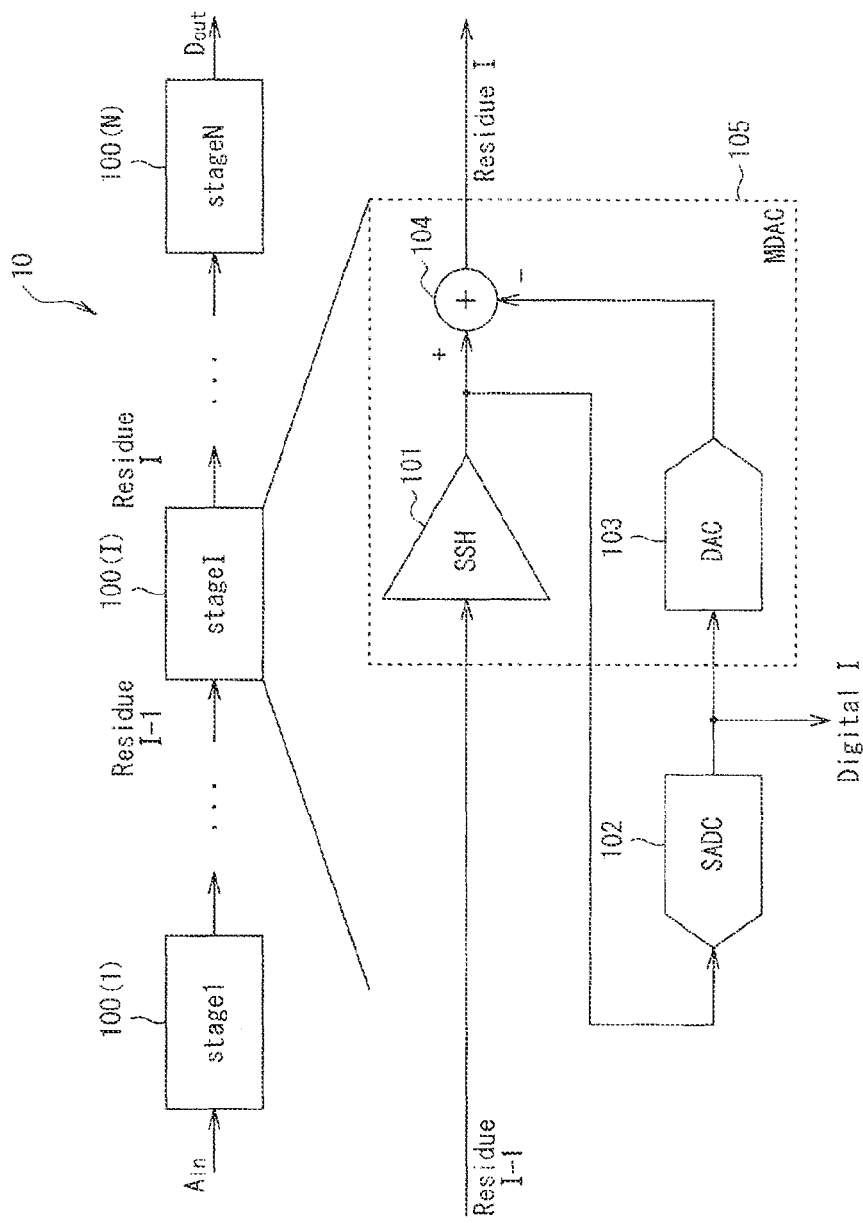
FIG. 7 is a schematic configuration view illustrative of an example of the pipelined A/D converter.

The A/D converter 1 is different from the pipelined A/D converter 10 illustrated in FIG. 7 in that an MDAC 110 is provided instead of the MDAC 105. It is to be noted that same reference numerals are applied to component elements having the same functions as the pipelined A/D converter 10 illustrated in FIG. 7, and the descriptions thereof will be omitted.

Figure 2A:
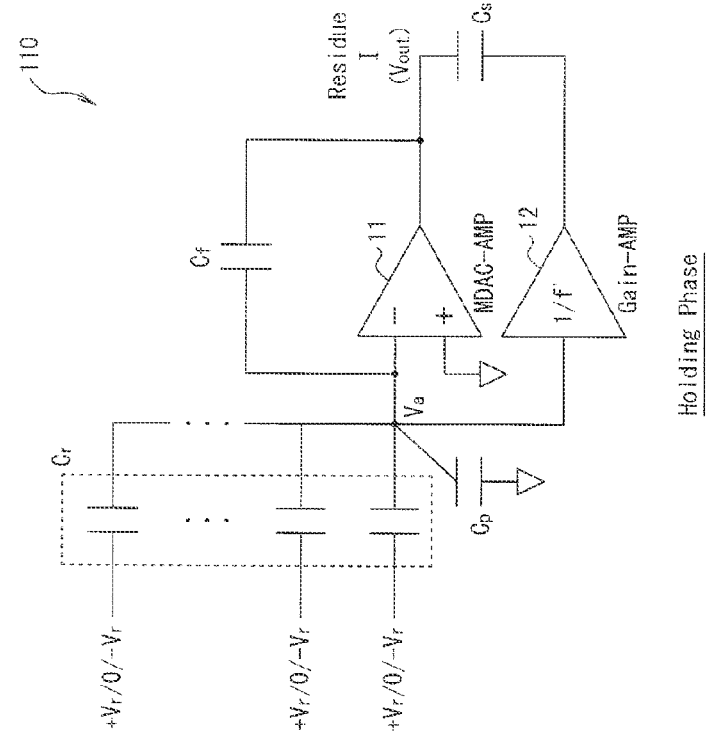
FIG. 2A and FIG. 2B are conceptual views illustrative of an example of a multiplying DA converter using SPM.
Figure 2B:
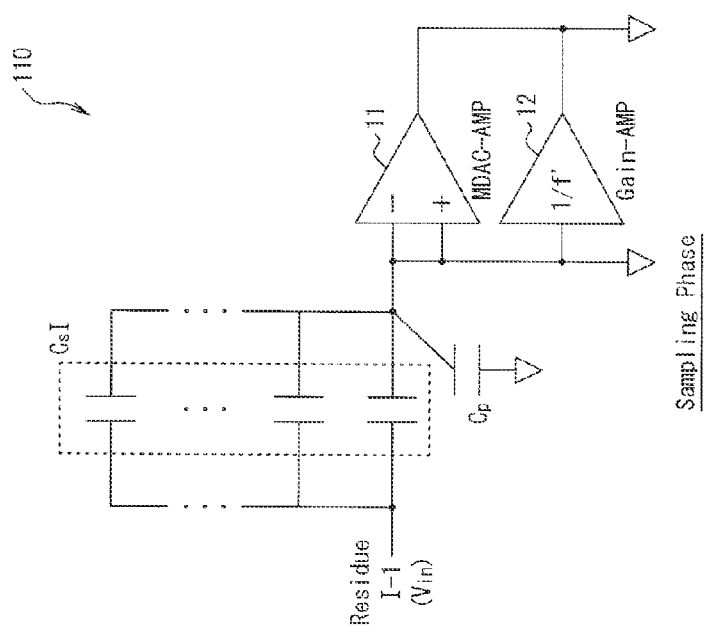

The MDAC 110 is an MDAC using the SPM. FIG. 2A and FIG. 2B illustrate conceptual views of the MDAC 110 using the SPM.

Figure 8A:
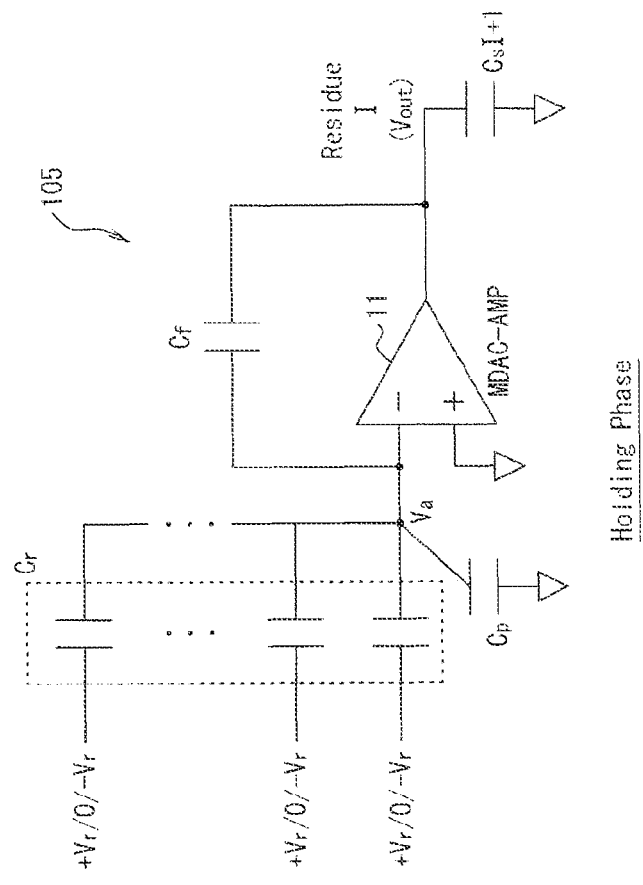
FIG. 8A and FIG. 8B are schematic configuration views illustrative of an example of the multiplying DA converter.
Figure 8B:
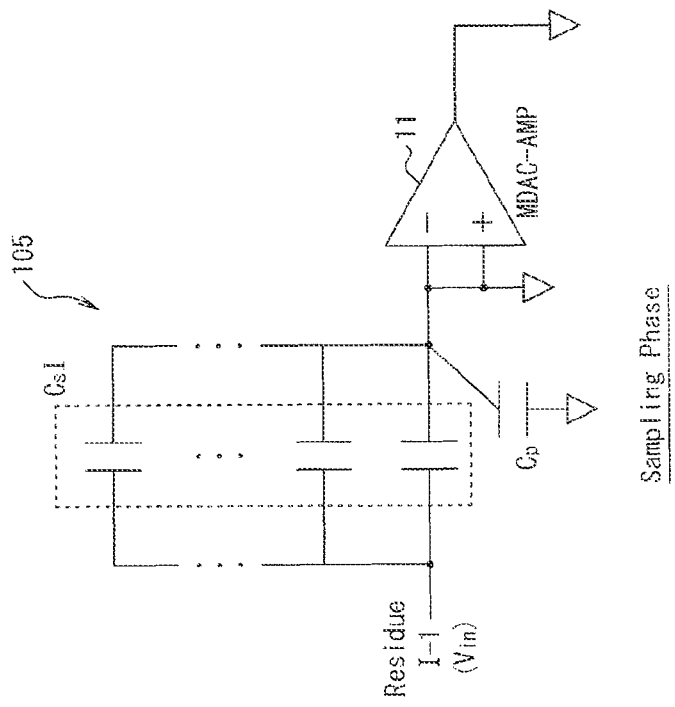

The MDAC 110 using the SPM is, as illustrated in FIG. 2A and FIG. 2B, configured to use a Gain-AMP 12 which is a gain amplifier for monitoring the voltage Va at an input end of the MDAC-AMP 11 referred to as Summing Point (i.e., adding point), as compared to the above-described MDAC 105 illustrated in FIG. 8A and FIG. 8B.

The Gain-AMP 12 is short-circuited such that input and output ends are short-circuited to the ground level in the sampling phase, whereas the input end is connected to the Summing Point in the holding phase and the output end is connected to a sampling capacitor CsI+1 of the MDAC 110 included in the unit block StageI+1 on the subsequent stage. In other words, by alternately repeating the sampling phase (of FIG. 2A) and the holding phase (of FIG. 2B), a signal, in which the voltage Va at the Summing Point is amplified in the Gain-AMP 12, namely (1/f')×Va is accumulated in the sampling capacitor CsI+1 on the subsequent stage. It is to be noted that (1/f') is a gain of the Gain-AMP 12.

The output Vout (i.e., MDAC) from the MDAC-AMP 11 in the MDAC 110 using the SPM illustrated in this FIG. 2A and FIG. 2B is identical to the output Vout from the MDAC-AMP 11 in the MDAC 105, illustrated in FIG. 8A and FIG. 8B, in which the Gain-AMP 12 is not provided. Thus, from the above expression (3), the output Vout can be represented by following expression (6).

$$Vout(MDAC) = (CsI/Cf) \times \{1/(1+1/(a0 \times f))\} \times Vin \quad (6)$$

On the other hand, the output Vout (i.e., SPM) from the Gain-AMP 12 can be represented by following expression (7), where 1/f' is the gain of the Gain-AMP 12.

$$Vout(SPM) = (1/f') \times Va = -1/(a0 \times f') \times Vout(MDAC) \quad (7)$$

In the MDAC 110 using the SPM illustrated in FIG. 2A and FIG. 2B, since a difference between the output Vout (MDAC) from the MDAC-AMP 11 and the output Vout (SPM) from the Gain-AMP 12 is a total output from the unit block StageI, the output Vout from the unit block StageI can be represented by following expression (8).

$$\begin{aligned} Vout &= Vout(MDAC) - Vout(SPM) \\ &= Vout(MDAC) + 1/(a0 \times f') \times Vout(MDAC) \\ &= (CsI/Cf) \times \{1/(1+1/(a0 \times f))\} \times \\ &\quad \{1+1/(a0 \times f')\} \times Vin \end{aligned} \quad (8)$$

Here, when "f" is equal to "f", the expression (8) can be represented by following expression (9).

$$Vout = (CsI/Cf) \times Vin \quad (9)$$

From the expression (9), it is understood that the output Vout from the unit block StageI in the MDAC 110 using the SPM does not rely on the DC Gain "a0" of the MDAC-AMP 11. In other words, a high gain property can be kept, even when the DC Gain "a0" is low.

Figure 3:
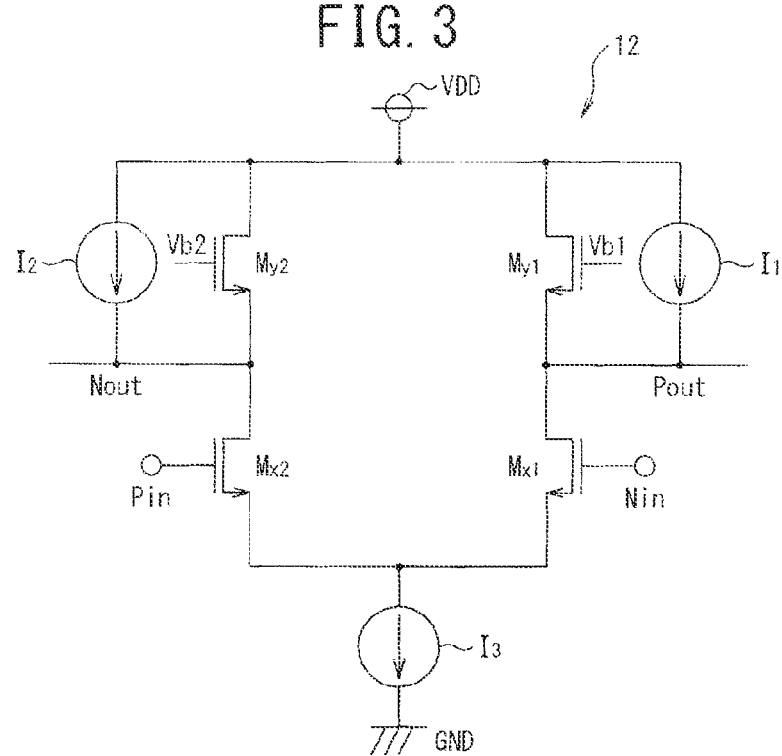
FIG. 3 is a conceptual view illustrative of an example of a Gain-AMP in one embodiment of the present disclosure.

FIG. 3 is a conceptual view illustrative of an example of the Gain-AMP 12 included in the MDAC 110 illustrated in FIG. 1. It is to be noted that in each of the above drawings, in order to simplify the description, the case where the Gain-AMP 12 is configured with a single-ended circuit has been described. In FIG. 3, however, a case where the Gain-AMP 12 is configured with a fully differential circuit will be described.

Herein, in the pipelined A/D converter 1 in one embodiment of the present disclosure, for the Stage1 (100(1)), the MDAC 110 using the SPM illustrated in FIG. 2 is mounted as the MDAC, and the Gain-AMP illustrated in FIG. 3 is used as the Gain-AMP 12 thereof. For the Stage2 (100(2)) to StageN (100(N)), the MDAC 105, illustrated in FIG. 8A and FIG. 8B, in which the Gain-AMP 12 is not provided, is mounted.

In other words, in the pipelined A/D converter 1, the highest DC Gain "a0" is demanded for the Stage1 (100(1)). For that purpose, in one embodiment of the present disclosure, on the Stage1 (100(1)), the MDAC 110 using the SPM illustrated in FIG. 2A and FIG. 2B is mounted as the MDAC, and the Gain-AMP illustrated in FIG. 3 is used as the Gain-AMP 12 thereof.

It is to be noted that the present disclosure is not limited to the above embodiment. For all of the Stage1 (100(1)) to StageN (100(N)) or plural Stages thereof, the MDAC 110 using the SPM illustrated in FIG. 2A and FIG. 2B is mounted as the MDAC, and the Gain-AMP illustrated in FIG. 3 can be used as the Gain-AMP 12 thereof.

Returning to FIG. 3, the Gain-AMP 12 in one embodiment of the present disclosure is, as illustrated in FIG. 3, configured to include differential MOS transistors Mx1 and Mx2 each being configured with an N-channel MOS transistor connected to the Summing Point, MOS transistors My1 and My2 connected to the output, and current sources I1, I2, and I3 having variable current values, respectively. The MOS transistors Mx1, Mx2, My1, and My2 are each configured with a MOS transistor having an identical functional configuration.

In other words, as illustrated in FIG. 3, the MOS transistors My2 and Mx2 connected in series and the MOS transistors My1 and Mx1 connected in series are connected in parallel between the power supply VDD and the ground GND. In addition, a current source I3 is arranged between the MOS transistors Mx1 and Mx2, and the ground GND.

Also, a connection point of the MOS transistors My1 and Mx1 is one output end Pout of the Gain-AMP 12. Further, a current source I1 is connected in parallel with the MOS transistor My1. Similarly, a connection point of the MOS transistors My2 and Mx2 is the other output end Nout of the Gain-AMP 12, and a current source I2 is connected in parallel with the MOS transistor My2. In other words, the Gain-AMP 12 is a non-discrete gain amplifier, and is also a capless gain amplifier in which a switched capacitor is not provided.

Then, the gate of the MOS transistor Mx2 is connected to one input end Pin of the Gain-AMP 12, whereas the gate of the MOS transistor Mx1 is connected to the other input end Nin of the Gain-AMP 12. The input end Pin/Nin corresponds to the input end of the Gain-AMP 12 in FIG. 2A and FIG. 2B, and is connected to the Summing Point.

In addition, the gates of the MOS transistors My1 and My2 are connected to fixed voltages Vb1 and Vb2 large enough for the MOS transistors to be in saturation ranges, respectively.

Further, the output end Pout/Nout corresponds to the output end of the Gain-AMP 12 in FIG. 2A and FIG. 2B, and is connected to the sampling capacitor CsI+1 on the subsequent stage.

The gain of the Gain-AMP 12 illustrated in FIG. 3 can be represented by following expression (10), where gmx is a transconductance of each of the MOS transistors Mx1 and Mx2 and gmy is a transconductance of each of the MOS transistors My1 and My2.

$$1/f' = gmx/gmy \quad (10)$$

Herein, the MOS transistors Mx1, Mx2, My1, and My2 are each configured with a MOS transistor of the same type, and have an identical functional configuration. Therefore, the property of the Gain-AMP 12 is that it is hardly affected by a variation in the process.

Figure 4:
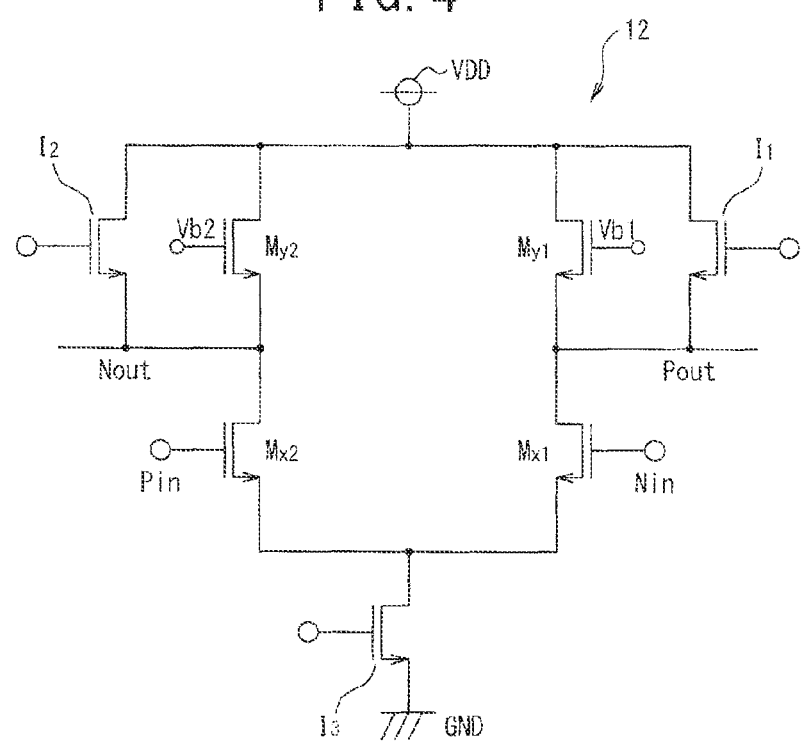
FIG. 4 is a conceptual view illustrative of another example of the Gain-AMP in one embodiment of the present disclosure.

It is to be noted that the current sources I1, I2, and I3 can be configured with a MOS transistor, as illustrated in FIG. 4, respectively.

When the current source I3 is configured with a MOS transistor, a simple amplifier is configured such that the power supply voltage of the power supply VDD is connected by three MOS transistors to the ground GND. Hence, an effect that the input and output amplitudes are hardly affected by a limitation of the power supply voltage or an operation point of the MOS transistor is obtainable.

Returning to FIG. 3, in general, the transconductance gm of the MOS transistor can be represented by following expression (11), where W/L is a size of the MOS transistor (where W is a gate width of the MOS transistor and L is a gate length of the MOS transistor) and i is the current flown across the MOS transistor. It is to be noted that K in expression (11) is a fixed number depending on the process.

$$gm = 2 \times \{K \times (W/L) \times i\}^{1/2} \quad (11)$$

In other words, the value of the transconductance gm of the MOS transistor has a proportional relationship with a ½ power of the current i flown across the MOS transistor. Accordingly, it is understood that the value of the transconductance gm is changed by finely adjusting the current values of the current sources I1, I2, and I3, so that the gain 1/f' of the Gain-AMP 12 can be changed.

Figure 5:
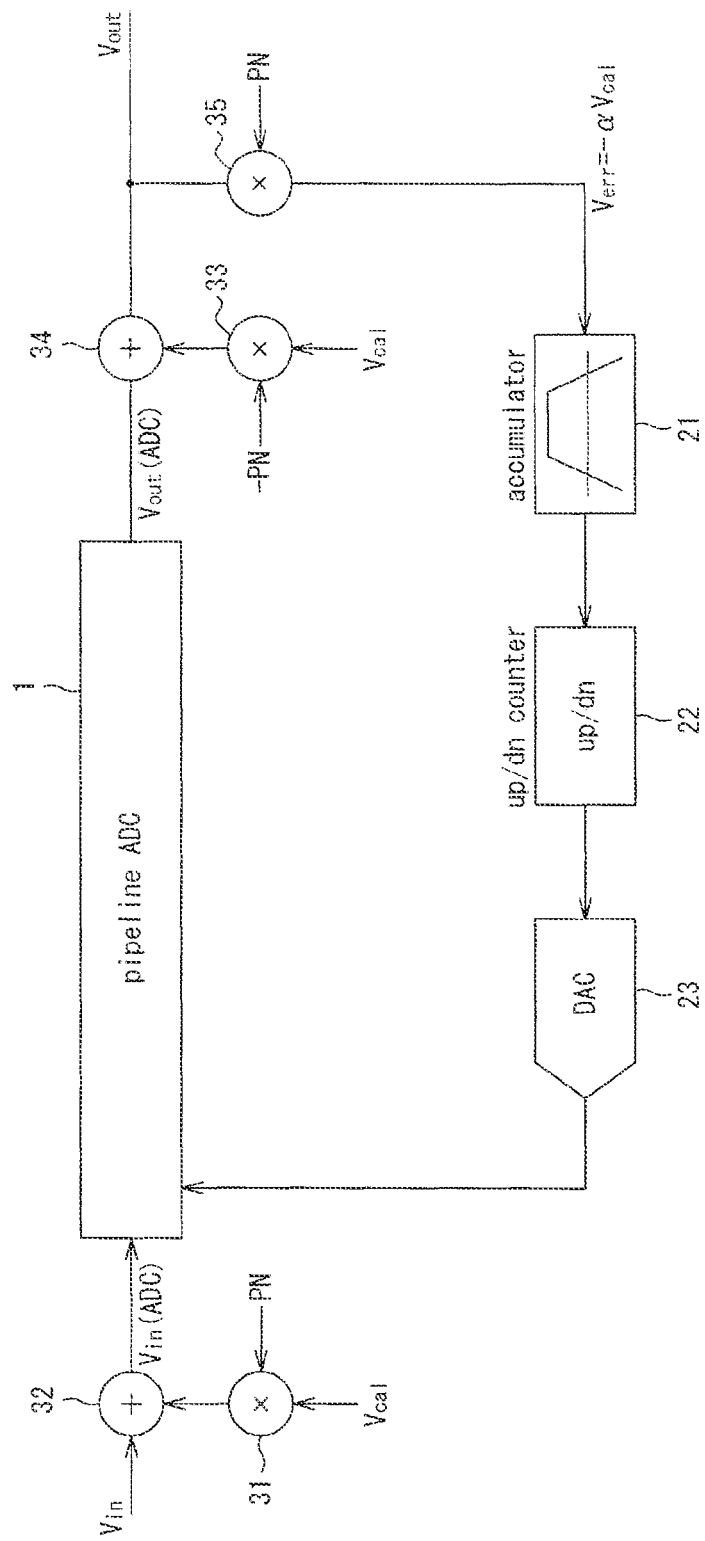
FIG. 5 is a schematic configuration view illustrative of an example of a circuit configured to adjust the Gain-AMP included in the multiplying DA converter of FIG. 2A and FIG. 2B.

FIG. 5 is a schematic configuration view illustrative of an example of a circuit configured to adjust a gain 1/f' of the Gain-AMP 12, in the pipelined A/D converter 1 including the Gain-AMP 12 illustrated in FIG. 3.

In FIG. 5, as to the pipelined A/D converter 1, as described above, an MDAC 110 using the SPM illustrated in FIG. 2A and FIG. 2B as the MDAC is mounted, and the Gain-AMP illustrated in FIG. 3 is used as the Gain-AMP 12 thereof in the Stage1 in the MDAC included in the pipelined A/D converter 1 illustrated in FIG. 1.

In FIG. 3, the gain "1/f'" of the Gain-AMP 12 is different from an inverse number "1/f" of a feedback factor of the MDAC 110. Therefore, if the input/output property of the pipelined A/D converter 1 is non-linear, the input/output property in this case can be assumed as indicated by following expression (12).

$$Vout(ADC) = (1-\alpha) \times Vin(ADC) \quad (12)$$

α in the expression (12) can be represented as follows by using the gain "1/f'" of the Gain-AMP 12 and the inverse number "1/f" of the feedback factor of the MDAC 110.

$$\alpha = Cf/Cs \times (1/a0) \times (1/f' - 1/f) \quad (13)$$

Here, a signal PN×Vcal, which is a random variable PN of either "1" or "−1" multiplied by a certain voltage Vcal, is added to an input signal Vin of analog signal, and the added analog signal Vin (ADC) is input into the pipelined A/D converter 1. For example, the voltage Vcal should be set based on the time to be used for demanded input amplitude or correction, for example.

After the signal is converted from analog to digital through the pipelined A/D converter 1, a digital signal corresponding to the analog signal PN×Vcal that has been added to the input signal Vin is subtracted from the digital signal Vout (ADC) corresponding to the analog signal Vin (ADC) output from the pipelined A/D converter 1. As a result of subtraction, that is the output Vout can be represented by following expression (14).

$$Vout = Vin - \alpha \times (Vin + PN \times Vcal) \quad (14)$$

In this situation, when the random variable PN used for calculating the analog signal PN×Vcal that has been added to the input signal Vin is multiplied by the output Vout represented by the expression (13), as the random variable PN is either "1" or "−1" and PN×PN=1 is satisfied, as described above, PN×Vout can be represented by following expression (15).

$$PN \times Vout = PN \times Vin(1-\alpha) - \alpha Vcal \quad (15)$$

When the PN×Vin, that is the random variable PN multiplied by the input signal Vin, is averaged in the long term, its result becomes zero. Hence, after all, the expression (15) can be represented by expression (16).

$$PN \times Vout = -\alpha Vcal \quad (16)$$

Here, by using an accumulator 21, an up/down counter (i.e., up/dn counter) 22 configured to detect the signal PN×Vout (=−α×Vcal=Verr) in the long term, and a DAC (i.e., D/A converter) 23, the gain of the Gain-AMP 12 of the MDAC 110 included in the pipelined A/D converter 1 is adjusted so that Verr (i.e., error signal) becomes zero.

In other words, in the accumulator 21, the error signal Verr which has been input is accumulated. In the up/down counter 22, when the accumulated value is smaller than 0, from the expression (13), 1/f' can be considered to be larger than 1/f. Thus, an instruction signal for decreasing the gain of the Gain-AMP 12 is output. Conversely, when the accumulated value at the accumulator 21 is larger than zero, from the expression (13), 1/f' can be considered to be smaller than 1/f. Thus, an instruction signal for increasing the gain of the Gain-AMP 12 is output.

In the DAC 23, the current values of the current sources I1 to I3 are adjusted in accordance with the instruction signal of the up/down counter 22. For example, in decreasing 1/f', the current quantities of the current sources I1, I2 and I3 are decreased, and 1/f' is decreased by decreasing the transconductance gmx of the MOS transistors Mx1 and Mx2. Conversely, the current quantities of the current sources I1, I2 and I3 are increased, 1/f is increased by increasing the transconductance gmx of the MOS transistors Mx1 and Mx2.

As described above, α=0 is met by adjusting the gain of the Gain-AMP 12.

Thus, when α=0 is substituted for the expression (14), the expression (14) results in that Vout=Vin is satisfied. In other words, it becomes same with the input signal Vin has been subjected to the analog-digital conversion ideally.

It is to be noted that in FIG. 5, a reference numeral 31 denotes an operation unit configured to multiply the random variable PN generated in a random signal generator or the like, not illustrated, by a preset voltage Vcal. A reference numeral 32 denotes an adder configured to add the input signal Vin to the pipelined A/D converter 1 and the operation result PN×Vcal of the operation unit 31, and to output an addition result Vin' to the pipelined A/D converter 1. A reference numeral 33 denotes an operation unit configured to multiply a negative value (−PN) of the random variable PN generated in the random signal generator or the like, not illustrated, by the preset voltage Vcal. A reference numeral 34 denotes an adder configured to add the operation result −PN× Vcal of the operation unit 33 and the output Vout (ADC) from the pipelined A/D converter 1, and to output the addition result as the output Vout. A reference numeral 35 denotes an operation unit configured to multiply the random variable PN generated in the random signal generator or the like by the output Vout from the adder 34.

As described heretofore, according to the pipelined A/D converter 1 in one embodiment of the present disclosure, an accurate analog-digital conversion can be performed without adding a new capacitance. In addition, even when the DC Gain "a0" of the MDAC-AMP 11 is low, the accurate analog-digital conversion can be performed. Thus, while suppressing an increase of noise, the analog-digital conversion with accuracy is achievable.

Figure 9C:
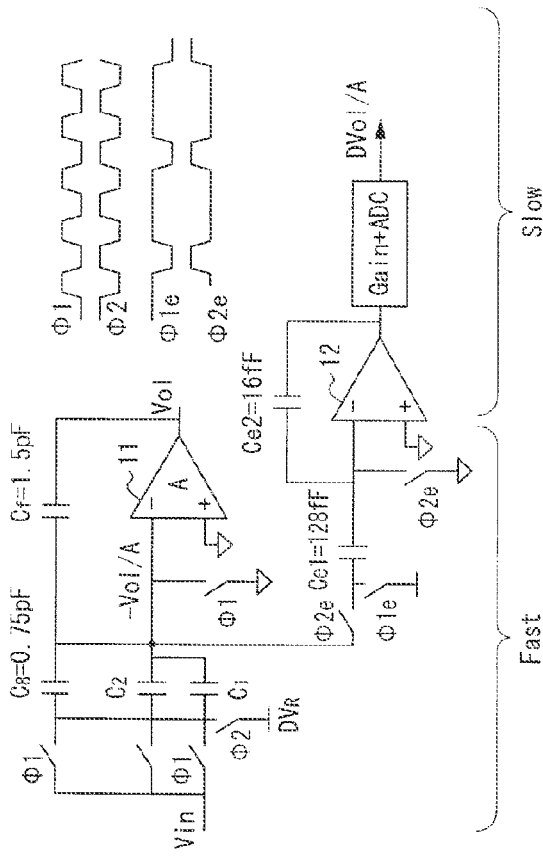
FIG. 9A to FIG. 9C are an example of a specific circuit of the multiplying DA converter of FIG. 8A and FIG. 8B.
Figure 9A:
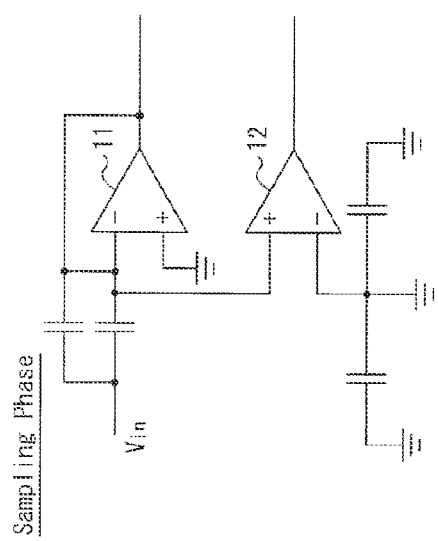
Figure 9B:
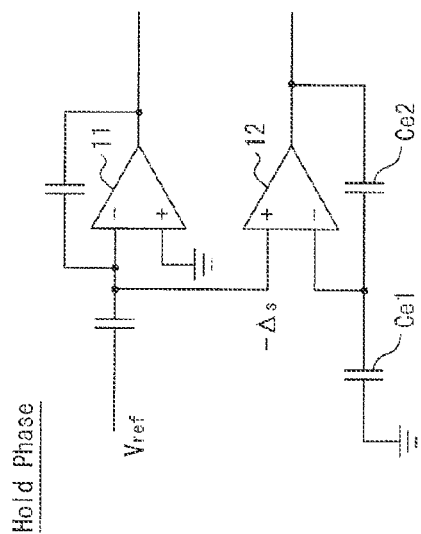

Further, for example, like the circuit configured to realize the SPM of FIG. 9A to FIG. 9C, as compared to the method of adjusting the gain by feeding back the output from the AMP to produce the gain "1/f" of the Gain-AMP 12, the Gain-AMP 12 in one embodiment of the present disclosure has a simple circuit configuration, as illustrated in FIG. 3. Therefore, the power consumption can be suppressed small.

In addition, even when the DC Gain "a0" of the MDAC-AMP 11 is comparatively small, as the analog-digital conversion can be performed precisely, the DC Gain "a0" of the MDAC-AMP 11 can be suppressed small. Therefore, the MDAC-AMP11 is also achievable with a simple configuration. In other words, as the power supply voltage can be made smaller, the power consumption can be further suppressed.

Figure 6:
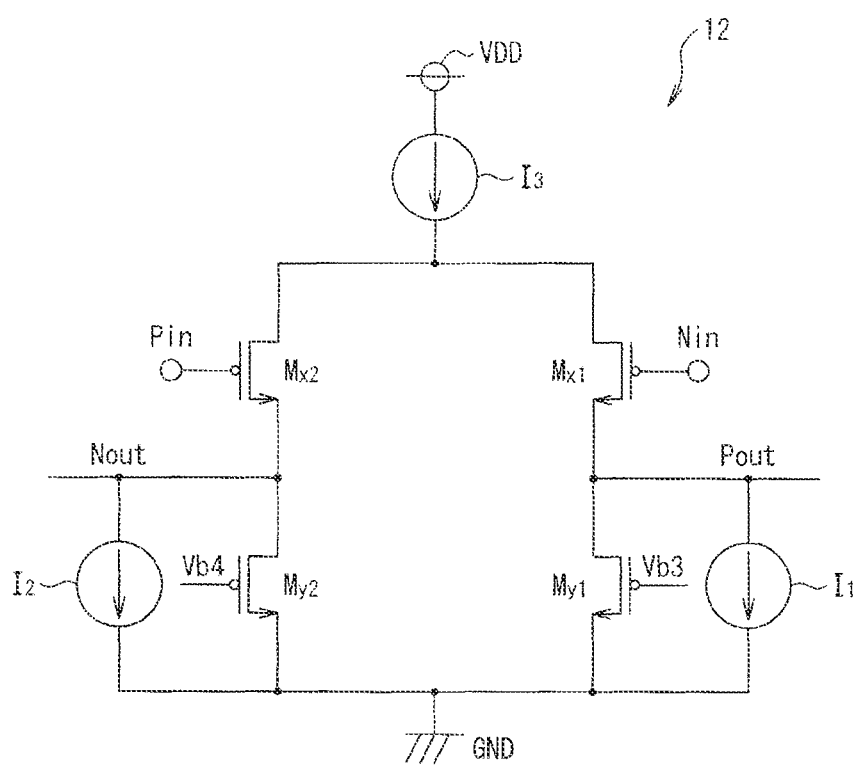
FIG. 6 is a conceptual view illustrative of further another example of the Gain-AMP in one embodiment of the present disclosure.

It is to be noted that in the above-described embodiments of the present disclosure, the description has been given of the case where the Gain-AMP 12 is configured with an N-channel MOS transistor, but can be configured with a P-channel MOS transistor. In this case, as illustrated in FIG. 6, the differential MOS transistors Mx1 and Mx2, each being configured with a P-channel MOS transistor, connected to the Summing Point, the MOS transistors My1 and My2 connected to the output, and the current sources I1, I2, and I3 having variable current values, respectively. It is to be noted that the MOS transistors Mx1, Mx2, My1 and My2 are configured with the P channel MOS transistors each having an identical functional configuration.

In other words, as illustrated in FIG. 6, the MOS transistors Mx2 and My2 connected in series and the MOS transistors Mx1 and My1 connected in series are connected in parallel between the power supply VDD and the ground GND. Further, the current source I3 is arranged between the MOS transistors Mx1 and Mx2.

In addition, a connection point of the MOS transistors Mx1 and My1 is one output end Pout of the Gain-AMP 12. Furthermore, the current source I1 is connected in parallel with the MOS transistor My1. Similarly, a connection point of the MOS transistors Mx2 and My2 is the other output end of the Gain-AMP 12 Nout. Furthermore, the current source I2 is connected in parallel with the MOS transistor My2.

Then, the gate of the MOS transistor Mx2 is connected to one input end Pin of the Gain-AMP 12, and the gate of the MOS transistor Mx1 is connected to the other input end Nin of the Gain-AMP 12.

The input end Pin/Nin corresponds to the input end of the Gain-AMP 12 in FIG. 2A and FIG. 2B, and is connected to the Summing Point.

Also, the gates of the MOS transistors My1 and My2 are connected to fixed voltages Vb3 and Vb4 large enough for the MOS transistors to be in saturation ranges, respectively.

Further, the output ends Pout and Nout correspond to the output end of the Gain-AMP 12 in FIG. 2, and is connected to the sampling capacitor CsI+1 on the subsequent stage.

With the above-described configuration, the same operation effects as the case where the Gain-AMP 12 is configured with an N-channel MOS transistor are obtainable.

It is to be noted that in the above-described embodiments, the description has been given of the case where the sample hold circuit in some embodiments of the present disclosure is applied to the MDAC included in the pipelined A/D converter. The present disclosure, however, is not limited to the above-described embodiments. For example, any sample hold circuit included in a ΔΣ A/D converter or the like is applicable.

Also, the scope of the present disclosure is not limited to the exemplary embodiments that have been illustrated and described, and includes all embodiments that can bring an equivalent effect that the present disclosure is directed to. Furthermore, the scope of the present disclosure can be defined by every desired combination of specific features, all of which have been disclosed herein.

In one embodiment of the present disclosure, there is provided a sample hold circuit, including: a sampling capacitor (for example, sampling capacitor CsI in FIG. 2A and FIG. 2B); a first amplifier (for example, MDAC-AMP 11 in FIG. 2A and FIG. 2B) having an input end to which the sampling capacitor is connected; and a second amplifier (for example, Gain-AMP 12 in FIG. 2A and FIG. 2B) connected to the first amplifier, wherein the second amplifier includes: a differential pair (for example, MOS transistors Mx1 and Mx2 in FIG. 3); a load unit (for example, MOS transistors My1 and My2 in FIG. 3) connected to the differential pair; and a variable current unit (for example, current sources I1 to I3 in FIG. 3) configured to supply a current to at least one of the differential pair or the load unit, wherein in a holding phase, the second amplifier is configured to monitor a voltage (for example, Va in FIG. 2B) at a summing point that is a connection point of the sampling capacitor at the input end of the first amplifier.

The second amplifier may be configured to supply a monitoring result of the voltage at the summing point to another sampling capacitor (for example, sampling capacitor CsI+1 in FIG. 2A and FIG. 2B) of another sample hold circuit on a subsequent stage.

An input end of the differential pair may be connected to the summing point, and an output end of the differential pair may be connected to a sampling capacitor included in the above another sample hold circuit on the subsequent stage.

The variable current unit may include: a first variable current unit (for example, current source I3 in FIG. 3) configured to supply the current to the differential pair; and a second variable current unit (for example, current sources I1 and I2 in FIG. 3) configured to adjust the current flown across the load unit.

The differential pair may include first and second MOS transistors (for example, MOS transistors Mx1 and Mx2 in FIG. 3).

The load unit may include third and fourth MOS transistors (for example, MOS transistors My1 and My2 in FIG. 3) respectively cascade-connected to the first and second MOS transistors.

The first to fourth MOS transistors may be configured with MOS transistors of same type.

The first variable current unit may include a fifth MOS transistor (for example, current source I3 in FIG. 4).

The second variable current unit may include first and second current sources (for example, current sources I1 and I2 in FIG. 4) connected in parallel with the load unit, and each of the first and second current sources may include sixth and seventh MOS transistors.

A controller (for example, DAC 23 in FIG. 5) configured to control at least one of the currents in the first and second variable current units may be further included.

In another embodiment of the present disclosure, there is provided a sample hold circuit, including: a first amplifier (for example, MDAC-AMP 11 in FIG. 2A and FIG. 2B); and an amplification unit (for example, Gain-AMP 12 in FIG. 2A and FIG. 2B) having an input end connectable to an input end of the first amplifier.

The amplification unit may be a non-discrete gain amplifier.

The amplification unit may be a capless gain amplifier.

The amplification unit may be capable of changing a gain.

The amplification unit having an output end may be connectable to a sampling capacitor (for example, sampling capacitor CsI+1 in FIG. 2A and FIG. 2B) included in another sample hold circuit on a subsequent stage.

In further another embodiment of the present disclosure, there is provided an A/D converter (for example, pipelined A/D converter 1 in FIG. 1) including the sample hold circuit according to any one of the above-described embodiments.

In yet another embodiment of the present disclosure, there is provided a calibration method of a sample hold circuit, the calibration method including: multiplying a random variable (for example, PN in FIG. 5) by a preset voltage (for example, Vcal in FIG. 5); adding a multiplied signal obtained by the multiplying to an input signal (for example, Vin in FIG. 5); inputting an analog signal (for example, Vin (ADC) in FIG. 5) obtained by the adding to the sample hold circuit (for example, MDAC 110 included in the pipelined A/D converter 1 in FIG. 5); performing an analog-digital conversion on the analog signal obtained by the adding through the sample hold circuit; subtracting a first digital signal (for example, Vout (ADC) in FIG. 5) corresponding to the multiplied signal from a second digital signal output from the sample hold circuit; multiplying a subtraction result by the random variable to set a multiplication result as an error signal (for example, Verr in FIG. 5); and adjusting a gain of a gain amplifier (for example, Gain-AMP 12 in FIG. 2A and FIG. 2B) included in the sample hold circuit so as to decrease the error signal.

The adjusting the gain of the gain amplifier may include: accumulating the error signal; outputting an instruction signal to decrease the gain of the gain amplifier when an accumulated value is a negative value, or outputting the instruction signal to increase the gain of the gain amplifier when the accumulated value is a positive value; and adjusting the gain in accordance with the instruction signal.

The random variable may be either 1 or −1.

The preset voltage may be set based on an input amplitude needed for the sample hold circuit or a time for calibration.

In yet another embodiment of the present disclosure, there is provided calibration method of a sample hold circuit, the calibration method including: inputting an analog signal to the sample hold circuit having a threshold changed by a random variable; performing an analog-digital conversion on the analog signal through the sample hold circuit; multiplying the random variable by a digital signal output from the sample hold circuit to set a multiplication result as an error signal; and adjusting a gain of a gain amplifier included in the sample hold circuit so as to decrease the error signal.

In yet another embodiment of the present disclosure, there is provided a calibration method of a sample hold circuit, the calibration method including: multiplying a random variable by a preset voltage; adding a multiplied signal obtained by the multiplying to an input signal; inputting an analog signal obtained by the adding to the sample hold circuit; performing an analog-digital conversion on the analog signal obtained by the adding through the sample hold circuit; subtracting a first digital signal corresponding to the multiplied signal from a second digital signal output from the sample hold circuit; multiplying a subtraction result by the random variable to set a multiplication result as an error signal; and adjusting a gain of a gain amplifier included in the sample hold circuit so as to decrease the error signal.

The adjusting may include: accumulating the error signal; outputting an instruction signal to decrease the gain of the gain amplifier when an accumulated value is a negative value, or outputting the instruction signal to increase the gain of the gain amplifier when the accumulated value is a positive value; and adjusting the gain in accordance with the instruction signal.

The random variable may be either 1 or −1.

The preset voltage may be set based on an input amplitude needed for the sample hold circuit or a time for calibration.

In yet another embodiment of the present disclosure, there is provided a calibration method of a sample hold circuit, including: inputting an analog signal to the sample hold circuit having a threshold changed by a random variable; performing an analog-digital conversion on the analog signal through the sample hold circuit; multiplying the random variable by a digital signal output from the sample hold circuit to set a multiplication result as an error signal; and adjusting a gain of a gain amplifier included in the sample hold circuit so as to decrease the error signal.

In yet another embodiment of the present disclosure, there is provided a circuit, including: a main path having an input end; and a subsidiary path having an input end connectable to the input end of the main path, and configured to correct an error caused by the main path at a place immediately subsequent to the main path.

In one embodiment of the present disclosure, even when the gain property of the first amplifier is low, the analog to digital conversion can be carried out with higher accuracy. In addition, since it is made available without adding a new capacitance, an increase of noise can be suppressed.

Further, the gain amplifier is achievable with a relatively simple configuration. Thus, the power consumption can be lowered, and the gain property of the first amplifier can be suppressed low, that is the first amplifier can be made with a simple configuration. Thus, the power supply voltage can be decreased, and the consumed power can be suppressed by the decreased amount.

REFERENCE SIGNS LIST 1 pipelined A/D converter
11 MDAC-AMP
12 Gain-AMP
21 accumulator (accumulator)
22 up/down counter (up/dn counter)
23 DAC (DA Converter)
110 multiplying digital/analog convertor
Mx1, Mx2, My1, My2 MOS transistors
I1, I2, I3 current sources

The invention claimed is:

1. A sample hold circuit, comprising:
a sampling capacitor;
a first amplifier having an input end to which the sampling capacitor is connected; and
a second amplifier connected to the first amplifier,
wherein the second amplifier comprises:
a differential pair;
a load unit connected to the differential pair; and
a variable current unit configured to supply a current to at least one of the differential pair or the load unit, and
wherein in a holding phase, the second amplifier is configured to monitor a voltage at a summing point that is a connection point of the sampling capacitor at the input end of the first amplifier.

2. The sample hold circuit according to claim 1, wherein the second amplifier is configured to supply a monitoring result of the voltage at the summing point to another sampling capacitor of another sample hold circuit on a subsequent stage.

3. The sample hold circuit according to claim 2, wherein an input end of the differential pair is connected to the summing point, and an output end of the differential pair is connected to a sampling capacitor included in the another sample hold circuit on the subsequent stage.

4. The sample hold circuit according to claim 1,
wherein the variable current unit comprises:
a first variable current unit configured to supply the current to the differential pair; and
a second variable current unit configured to adjust the current flown across the load unit.

5. The sample hold circuit according to claim 1, wherein the differential pair comprises first and second MOS transistors.

6. The sample hold circuit according to claim 5, wherein the load unit comprises third and fourth MOS transistors respectively cascade-connected to the first and second MOS transistors.

7. The sample hold circuit according to claim 6, wherein the first to fourth MOS transistors are configured with MOS transistors of same type.

8. The sample hold circuit according to claim 4, wherein the first variable current unit comprises a fifth MOS transistor.

9. The sample hold circuit according to claim 4, wherein the second variable current unit comprises first and second current sources connected in parallel with the load unit, and each of the first and second current sources comprises sixth and seventh MOS transistors.

10. The sample hold circuit according to claim 4, further comprising a controller configured to control at least one of the currents in the first and second variable current units.

11. An A/D converter, comprising the sample hold circuit according to claim 1.

12. A calibration method of a sample hold circuit, the calibration method comprising:
multiplying a random variable by a preset voltage;
adding a multiplied signal obtained by the multiplying to an input signal;
inputting an analog signal obtained by the adding to the sample hold circuit;
performing an analog-digital conversion on the analog signal obtained by the adding through the sample hold circuit;
subtracting a first digital signal corresponding to the multiplied signal from a second digital signal output from the sample hold circuit;
multiplying a subtraction result by the random variable to set a multiplication result as an error signal; and
adjusting a gain of a gain amplifier included in the sample hold circuit so as to decrease the error signal.

13. The calibration method of the sample hold circuit according to claim 12,
wherein the adjusting the gain of the gain amplifier comprises:
accumulating the error signal;
outputting an instruction signal to decrease the gain of the gain amplifier when an accumulated value is a negative value, or outputting the instruction signal to increase the gain of the gain amplifier when the accumulated value is a positive value; and
adjusting the gain in accordance with the instruction signal.

14. The calibration method of the sample hold circuit according to claim 12, wherein the random variable is either 1 or −1.

15. The calibration method of the sample hold circuit according to claim 12, wherein the preset voltage is set based on an input amplitude needed for the sample hold circuit or a time for calibration.

* * * * *